US010332667B2

(12) United States Patent
Jeong et al.

(10) Patent No.: US 10,332,667 B2
(45) Date of Patent: Jun. 25, 2019

(54) ELECTRONIC COMPONENT HAVING LEAD PART INCLUDING REGIONS HAVING DIFFERENT THICKNESSES AND METHOD OF MANUFACTURING THE SAME

(71) Applicant: SAMSUNG ELECTRO-MECHANICS CO., LTD., Suwon-Si, Gyeonggi-Do (KR)

(72) Inventors: Dong Jin Jeong, Suwon-Si (KR); Kyung Seop Lee, Suwon-Si (KR); Yong Un Choi, Suwon-Si (KR); Kyung Min Son, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 22 days.

(21) Appl. No.: 14/936,433

(22) Filed: Nov. 9, 2015

(65) Prior Publication Data

US 2016/0172103 A1 Jun. 16, 2016

(30) Foreign Application Priority Data

Dec. 12, 2014 (KR) ........................ 10-2014-0179809

(51) Int. Cl.
*H01F 27/29* (2006.01)
*H01F 41/10* (2006.01)
(Continued)

(52) U.S. Cl.
CPC ....... *H01F 27/255* (2013.01); *H01F 17/0013* (2013.01); *H01F 17/04* (2013.01);
(Continued)

(58) Field of Classification Search
CPC ................................ H01F 27/29; H01F 41/10
See application file for complete search history.

(56) References Cited

U.S. PATENT DOCUMENTS 6,912,115 B2 * 6/2005 Kobayashi ............... H01G 4/30 361/303
7,212,094 B2 * 5/2007 Matsutani ............... H01F 17/04 336/200
(Continued)

FOREIGN PATENT DOCUMENTS

CN 103366919 A 10/2013
CN 103515077 A 1/2014
(Continued)

OTHER PUBLICATIONS

Korean Office Action issued in Korean Patent Application No. 10-2014-0179809, dated Jun. 21, 2017, with English Translation.
(Continued)

*Primary Examiner* — Mang Tin Bik Lian
*Assistant Examiner* — Malcolm Barnes
(74) *Attorney, Agent, or Firm* — Morgan Lewis & Bockius LLP

(57) ABSTRACT

An electronic component includes a magnetic body; and a coil pattern embedded in the magnetic body, the coil pattern including an internal coil part having a spiral shape and a lead part connected to an end of the internal coil part and exposed to an external surface of the magnetic body. The lead part includes at least two regions having different thicknesses, and the thickness of at least a portion of the lead part having a relatively thin thickness is thinner than a thickness of the internal coil part.

12 Claims, 3 Drawing Sheets

I - I

(51) Int. Cl.

| | |
|---|---|
| ***H01F 27/255*** | (2006.01) |
| ***H01F 17/00*** | (2006.01) |
| ***H01F 17/04*** | (2006.01) |
| ***H01F 41/04*** | (2006.01) |

(52) U.S. Cl.

CPC ......... *H01F 27/292* (2013.01); *H01F 41/046* (2013.01); *H01F 2017/048* (2013.01)

(56) References Cited

U.S. PATENT DOCUMENTS

| | | | | |
|---|---|---|---|---|
| 7,663,464 | B2 * | 2/2010 | Yamamoto | H01F 17/0013 336/205 |
| 8,975,997 | B2 | 3/2015 | Tonoyama et al. | |
| 9,472,608 | B2 | 10/2016 | Lee et al. | |
| 2005/0068150 | A1 * | 3/2005 | Matsutani | H01F 17/04 336/223 |
| 2006/0214759 | A1 * | 9/2006 | Kawarai | H01F 17/0006 336/200 |
| 2008/0100409 | A1 | 5/2008 | Nishikawa et al. | |
| 2009/0278649 | A1 * | 11/2009 | Tatsukawa | H01F 17/0013 336/200 |
| 2013/0162382 | A1 * | 6/2013 | Cha | H01F 27/29 336/83 |
| 2013/0249662 | A1 * | 9/2013 | Tonoyama | H01F 27/255 336/200 |
| 2013/0341758 | A1 * | 12/2013 | Lee | H01L 28/10 257/531 |

FOREIGN PATENT DOCUMENTS

| | | | |
|---|---|---|---|
| EP | 1 705 672 | A2 | 9/2006 |
| JP | 2007-067214 | A | 3/2007 |
| JP | 2008-117851 | A | 5/2008 |
| JP | 2013-074060 | A | 4/2013 |
| KR | 10-2006-0102493 | A | 9/2006 |
| KR | 10-2013-0109047 | A | 10/2013 |
| WO | 2005052962 | A1 | 6/2005 |

OTHER PUBLICATIONS

Chinese Office Action dated Jun. 5, 2018 issued in Chinese Patent Application No. 201510829901.6 (with English translation).

* cited by examiner

ELECTRONIC COMPONENT HAVING LEAD PART INCLUDING REGIONS HAVING DIFFERENT THICKNESSES AND METHOD OF MANUFACTURING THE SAME

CROSS-REFERENCE TO RELATED APPLICATION

This application claims the benefit of priority to Korean Patent Application No. 10-2014-0179809, filed on Dec. 12, 2014 with the Korean Intellectual Property Office, the entirety of which is incorporated herein by reference.

BACKGROUND

The present disclosure relates to an electronic component and a method of manufacturing the same.

An inductor, an electronic component, is a representative passive element configuring an electronic circuit, together with a resistor and a capacitor to remove noise.

A thin film type inductor is manufactured by forming coil patterns by a plating process, hardening a magnetic powder-resin composite in which a magnetic powder and a resin are mixed with each other to manufacture a magnetic body, and then forming external electrodes on outer surfaces of the magnetic body.

In the case of a thin film type inductor, in accordance with recent changes to devices, such as increasing complexity, multifunctionalization, slimming, or the like, attempts to slim inductors continue. Thus, technology in which high performance and reliability can be secured despite the trend toward slimness of electronic components is required.

SUMMARY

One aspect of the present disclosure may provide an electronic component having reduced problems such as breakage defects, and the like which may be caused at the time of manufacturing a slimmed electronic component by sufficiently securing a region of a magnetic body around coil patterns, and a method having efficient manufacturing of the electronic component.

According to one aspect of the present disclosure, an electronic component may include a magnetic body, and a coil pattern embedded in the magnetic body, the coil pattern including internal coil parts having a spiral shape and lead parts connected to ends of the internal coil parts and externally exposed from the magnetic body. The lead parts may include regions having different thicknesses, and thicknesses of at least portions of the lead parts having a relatively thin thickness may be thinner than thicknesses of the internal coil parts.

Portions of the lead parts having a relatively thick thickness may have the same thicknesses as thicknesses of the internal coil parts.

The lead parts may have a step shape.

Thicknesses of the portions of the lead parts having the relatively thin thickness may be formed relatively close to an outer region of the magnetic body.

When a thickness of the internal coil part is a and a thickness of the portion of the lead part having the relatively thin thickness is b, $0.6 \leq b/a < 1$ may be satisfied.

When a width of the lead part is c and a width of the portion of the lead part having the relatively thin thickness is d, $0.6 < d/c < 1$ may be satisfied.

A thickness of a cover region covering an upper portion or a lower portion of the coil pattern in the magnetic body may be 150 μm or less.

The coil pattern may be formed by a plating process.

The coil pattern may include a first coil pattern disposed on one surface of an insulating substrate and a second coil pattern disposed on the other surface of the insulating substrate opposing the one surface of the insulating substrate.

The electronic component may further include external electrodes disposed on outer surfaces of the magnetic body and connected to the lead parts.

The magnetic body may include a magnetic metal powder and a thermosetting resin.

According to another aspect of the present disclosure, a method of manufacturing an electronic component may include forming coil patterns on an insulating substrate, and providing magnetic sheets on an upper surface and a lower surface of the insulating substrate on which the coil patterns are formed, to form a magnetic body. The coil patterns may include internal coil parts having a spiral shape and lead parts connected to ends of the internal coil parts and exposed to surfaces of the magnetic body, and the lead parts may include regions having different thicknesses and thicknesses of at least portions of the lead parts having a relatively thin thickness may be thinner than thicknesses of the internal coil parts.

Portions of the lead parts having a relatively thick thickness may have the same thicknesses as thicknesses of the internal coil parts.

The lead parts may be formed in a step shape.

The portions of the lead parts having the relatively thin thickness may be formed relatively close to an outer region of the magnetic body.

When a thickness of the internal coil part is a and a thickness of the portion of the lead part having the relatively thin thickness is b, $0.6 \leq b/a < 1$ may be satisfied.

When a width of the lead part is c and a width of the portion of the lead part having the relatively thin thickness is d, $0.6 < d/c < 1$ may be satisfied.

In the forming of the coil patterns, a plating process may be performed.

The method of manufacturing an electronic component may further include forming external electrodes on outer surfaces of the magnetic body to be connected to the lead parts.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
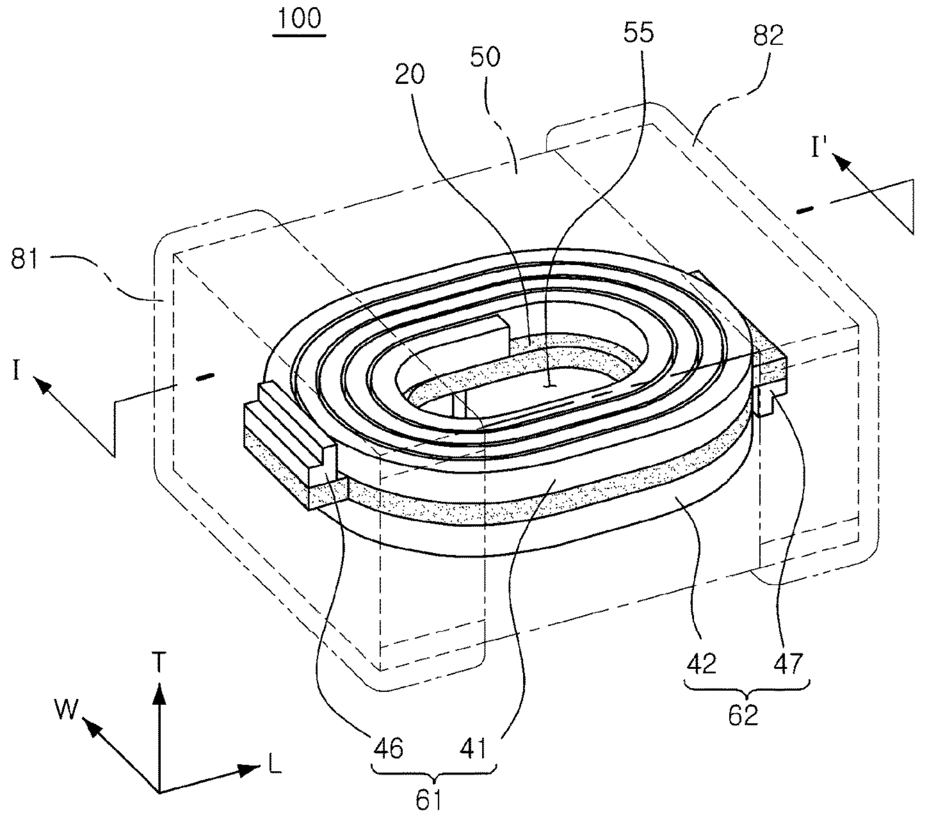
FIG. 1 is a schematic perspective view illustrating an electronic component according to an exemplary embodiment in the present disclosure so that coil patterns of the electronic component are visible.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Electronic Component

Hereinafter, an electronic component according to an exemplary embodiment, particularly a thin film type inductor, will be described as an example. However, the electronic component according to the exemplary embodiment is not limited thereto.

Figure 2:
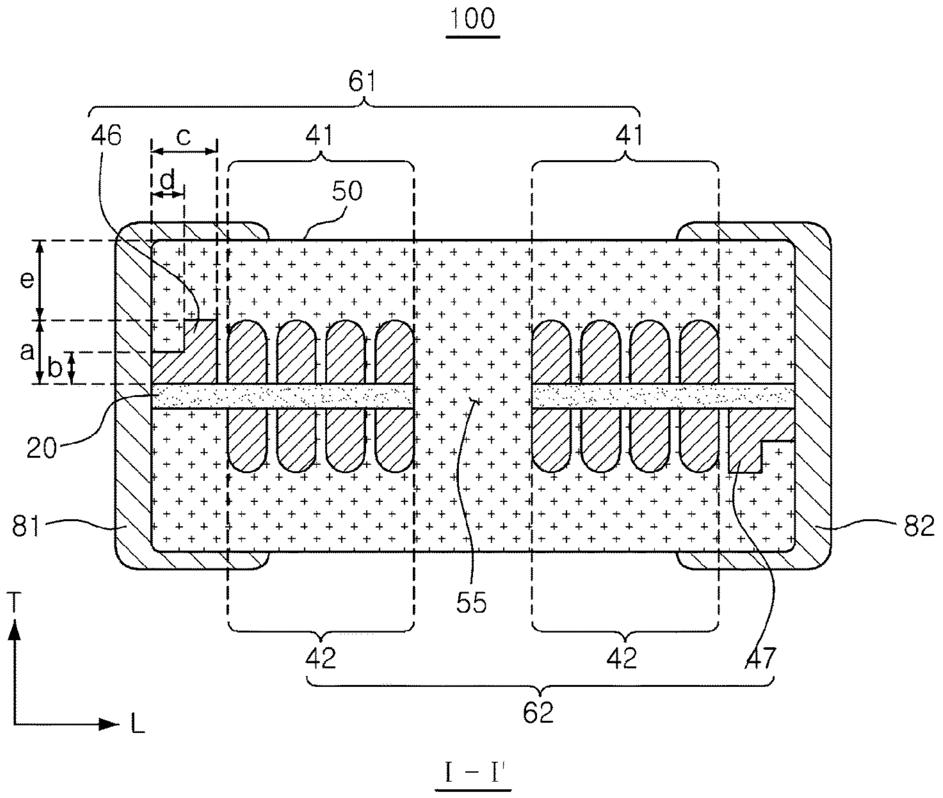
FIG. 2 is a cross-sectional view taken along line I-I' of FIG. 1.

FIG. 1 is a schematic perspective view illustrating an electronic component according to an exemplary embodiment so that internal coil patterns of the electronic component are visible and FIG. 2 is a cross-sectional view taken along line I-I' of FIG. 1. Referring to FIGS. 1 and 2, as an example of an electronic component, a thin film type inductor used in a power line, or the like, of a power supply circuit is disclosed.

The electronic component 100, according to an exemplary embodiment, may include a magnetic body 50, coil patterns 61 and 62 embedded in the magnetic body 50, and first and second external electrodes 81 and 82 disposed on outer surfaces of the magnetic body 50 and connected to the coil patterns 61 and 62.

In FIG. 1, a "length" direction refers to an "L" direction of FIG. 1, a "width" direction refers to a "W" direction of FIG. 1, and a "thickness" direction refers to a "T" direction of FIG. 1.

The shape of the magnetic body 50 may form a shape of the electronic component 100 and may be formed of any material that exhibits magnetic properties. For example, the magnetic body 50 may be formed by providing ferrite or magnetic metal particles in a resin part.

As a specific example of the above-mentioned materials, the ferrite may be made of an Mn—Zn-based ferrite, an Ni—Zn-based ferrite, an Ni—Zn—Cu-based ferrite, an Mn—Mg-based ferrite, a Ba-based ferrite, an Li-based ferrite, or the like, and the magnetic body 50 may have a form in which the above-mentioned ferrite particles are dispersed in a resin such as epoxy, polyimide, or the like.

In addition, the magnetic metal particles may contain any one or more selected from the group consisting of iron (Fe), silicon (Si), chromium (Cr), aluminum (Al), and nickel (Ni). For example, the magnetic metal particles may be an Fe—Si—B—Cr based amorphous metal, but are not limited thereto. The magnetic metal particles may have a diameter of about 0.1 μm to 30 μm, and the magnetic body 50 may have a form in which the above-mentioned magnetic metal particles are dispersed in the resin such as epoxy, polyimide, or the like, similar to the ferrite described above.

As illustrated in FIGS. 1 and 2, the first coil pattern 61 may be disposed on one surface of an insulating substrate 20 disposed in the magnetic body 50, and the second coil pattern 62 may be disposed on the other surface of the insulating substrate 20 opposing one surface of the insulating substrate 20. In this case, the first and second coil patterns 61 and 62 may be electrically connected to each other through a via (not illustrated) formed to penetrate through the insulating substrate 20.

The insulating substrate 20 may be, for example, a polypropylene glycol (PPG) substrate, a ferrite substrate, a metal based soft magnetic substrate, or the like. The insulating substrate 20 may have a through-hole formed in a central portion thereof so as to penetrate through the central portion thereof, wherein the through-hole may be filled with magnetic material to form a core part 55. As such, the core part 55 filled with the magnetic material may be formed, thereby improving performance of a thin film type inductor.

The first and second coil patterns 61 and 62 may each be formed in a spiral shape and may include internal coil parts 41 and 42 serving as a main region of a coil, and lead parts 46 and 47 connected to ends of the internal coil parts 41 and 42 and exposed to surfaces of the magnetic body 50. In this case, the lead parts 46 and 47 may be formed by extending one end portion of each of the internal coil parts 41 and 42, and may be exposed to surfaces of the magnetic body 50 so as to be connected to the external electrodes 81 and 82 disposed on the outer surfaces of the magnetic body 50.

The first and second coil patterns 61 and 62 and a via (not illustrated) may be formed of a material including a metal having excellent electrical conductivity, and may be formed of silver (Ag), palladium (Pd), aluminum (Al), nickel (Ni), titanium (Ti), gold (Au), copper (Cu), platinum (Pt), or alloys thereof. In this case, as an example of a process of forming the first and second coil patterns 61 and 62 in a thin film shape, the first and second coil patterns 61 and 62 may be formed by performing an electroplating method. However, other processes known in the art may also be used as long as they have a similar effect.

According to the present exemplary embodiment, a thickness b of some regions of the lead parts 46 and 47 may be formed to be thinner than a thickness a of the internal coil parts 41 and 42. As the thickness of the lead parts 46 and 47 is increased, an amount (or a volume) of the magnetic body 50 present around the lead parts 46 and 47 may be decreased. When the amount of the magnetic body 50 is decreased, the lead parts 46 and 47 may become vulnerable to the processes such as cutting, polishing, or the like, thereby increasing a defect rate. For instance, when the magnetic body 50 is cut into electronic components having a size corresponding thereto using a blade, a saw, or the like, stress caused by the above-mentioned equipment may be transferred to the internal coil parts 41 and 42. As the amount of the magnetic body 50 present around a cut region is small, for instance, the magnetic body 50 is thin, an influence of the above-mentioned stress may be increased.

By taking the above-mentioned problems into account, according to the present exemplary embodiment, the lead parts 46 and 47 may be formed to be relatively thin, and a region occupied by the magnetic body 50 around the lead parts 46 and 47 may be further secured. The relatively increased region of the magnetic body 50 may significantly reduce the influence of the stress on the internal coil regions in the following process as described above, thereby contributing to improve performance and reliability of the electronic component.

Further, according to an exemplary embodiment, the lead parts 46 and 47 may also include a region formed to be relatively thick, instead of forming the lead parts 46 and 47 to have the same thickness. The lead parts 46 and 47 may include the relatively thick region, and thus coupling force between the lead parts 46 and 47 and the magnetic body 50 may be increased, and electric resistance in an overall region of the lead parts 46 and may be reduced, thereby helping to improve electrical characteristics. In this case, as illustrated in FIG. 2, the region having the relatively thick thickness of the lead part 46 or 47 may be formed to have the same thickness a as that of the internal coil part. In detail, the lead parts 46 and 47 may be formed in a step shape. In this case, as described above, the region having the relatively thin thickness of the lead part 46 or 47 may be formed to be relatively close to an outer region of the magnetic body 50.

As described above, a positive effect of the lead parts 46 and 47 which are formed to be relatively thin may be further increased as the thickness of the magnetic body 50 is thin. Here, a case in which the magnetic body 50 is thin may be defined, for example, as a form in which a thickness e of cover regions covering an upper portion and a lower portion of the coil patterns 61 and 62 in the magnetic body 50 is about 150 μm or less.

As such, as the thickness of the lead parts 46 and 47 is thin, the internal coil parts 41 and 42 may be protected, but an area in which the internal coil parts 41 and 42 contact the external electrodes 81 and 82 may be decreased, thereby deteriorating electrical characteristics. In addition, a ratio of the region having the relatively thick thickness in each of the lead parts 46 and 47 may need to be determined by taking account of an effect according to an increase in a volume of the magnetic body 50, an adhesive strength improvement effect of the lead parts 46 and 47 and the magnetic body 50, and the like. In this respect, the thickness and width of the lead parts 46 and 47 may be appropriately determined by comparing the thickness and width with the internal coil parts 41 and 42. According to an experimental example, when the thickness of each of the internal coil parts 41 and 42 is a and a thickness of a thin region of the thickness of the lead part 46 or 47 is b, the thickness of the coil patterns may satisfy $0.6 \leq b/a < 1$. In addition, when an overall width of each of the lead parts 46 and 47 is c and a width of the region having the relatively thin thickness of the lead part 46 or 47 is d, a width of the coil patterns may satisfy $0.6 < d/c < 1$. When a ratio (b/a) of the thickness of an outermost region of each of the lead parts 46 and 47, for instance, the region having the relatively thin thickness to the thickness of each of the internal coil parts 41 and 42 is smaller than 0.6, since the thickness of the lead parts 46 and 47 is excessively thin, electrical performance deterioration of the electronic component is exhibited.

Meanwhile, the internal coil parts 41 and 42 and the lead parts 46 and 47 may be formed by a plating process. If the internal coil parts 41 and 42 and the lead parts 46 and 47 are formed by performing the plating process, the thickness of the lead parts 46 and 47 may be appropriately adjusted by adjusting current density, concentration of a plating solution, plating speed, or the like.

Method of Manufacturing Electronic Component

Figure 3:
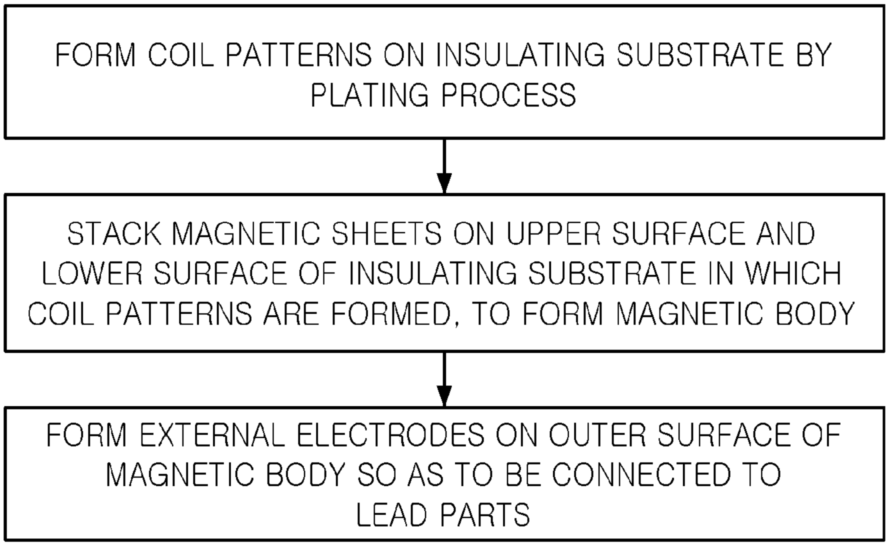
FIG. 3 is a schematic process flow chart describing a manufacturing process of an electronic component according to an exemplary embodiment in the present disclosure.

FIG. 3 is a process flow chart schematically describing a manufacturing process of an electronic component according to an exemplary embodiment. The method of manufacturing an electronic component in FIG. 3 will be described with reference to FIGS. 1 and 2.

First, coil patterns 61 and 62 may be formed on an insulating substrate 20. Here, a plating may be used, but is not necessarily used. As described above, the coil patterns 61 and 62 may include the internal coil parts 41 and 42 of the spiral shape, and the lead parts 46 and 47 formed by extending one end portion of each of the internal coil parts 41 and 42.

As described above, according to the present exemplary embodiment, the thickness b of the lead parts 46 and 47 may be formed to be thinner than the thickness a of the internal coil parts 41 and 42, thereby securing sufficient stability in the following process. In this case, the internal coil parts 41 and 42 and the lead parts 46 and 47 may be formed by performing the plating process, and the thickness b of the outermost region exposed to the outside of the lead parts 46 and 47 may be implemented to be thinner than the thickness a of the internal coil parts 41 and 42 by adjusting current density, concentration of a plating solution, plating speed, or the like.

Meanwhile, although not illustrated in FIGS. 1 and 2, in order to further protect the coil patterns 61 and 62, an insulating film (not illustrated) coating the coil patterns 61 and 62 may be formed, wherein the insulating film may be formed by a known method such as a screen printing method, an exposure and development method of a photoresist (PR), a spray applying method, or the like.

Next, the magnetic sheets may be stacked on upper and lower surfaces of the insulating substrate 20 on which the coil patterns 61 and 62 are formed, and the stacked magnetic sheets may then be compressed and cured to form the magnetic body 50. The magnetic sheets may be manufactured in a sheet shape by preparing slurry by mixtures of magnetic metal powder, and organic materials such as a binder, a solvent, and the like, applying the slurry at a thickness of several tens of micrometers onto carrier films by a doctor blade method, and then drying the slurry.

A central portion of the insulating substrate 20 may be removed by performing a mechanical drilling process, a laser drilling, sandblasting, a punching process, or the like to form a core part hole, and the core part hole may be filled with the magnetic material in the process of stacking, compressing and curing the magnetic sheets to form the core part 55.

Next, the first and second external electrodes 81 and 82 may be formed on the outer surfaces of the magnetic body 50 so as to be connected, respectively, to the lead parts 46 and 47 exposed to surfaces of the magnetic body 50. The external electrodes 81 and 82 may be formed of a paste containing a metal having excellent electrical conductivity, such as a conductive paste containing nickel (Ni), copper (Cu), tin (Sn), or silver (Ag), or alloys thereof. In addition, plated layers (not illustrated) may be further formed on the external electrodes 81 and 82. In this case, the plated layers may contain one or more selected from a group consisting of nickel (Ni), copper (Cu), and tin (Sn). For example, a nickel (Ni) layer and a tin (Sn) layer may be sequentially formed.

A description of features overlapping those of the electronic component according to the exemplary embodiment described above except for the above-mentioned description will be omitted.

As set forth above, according to an exemplary embodiment, the electronic component having reduced problems such as breakage defects and the like which may be caused at the time of manufacturing the slimmed electronic component may be provided, and further, a method having efficient manufacturing of the electronic component may be provided.

While exemplary embodiments have been shown and described above, it will be apparent to those skilled in the art that modifications and variations could be made without departing from the scope of the present invention as defined by the appended claims.

What is claimed is:

1. An electronic component comprising:

a magnetic body; and a coil pattern embedded in the magnetic body and disposed on and below an insulating substrate, each of the coil patterns including an internal coil part having a spiral shape and a lead part connected to each of ends of the internal coil part and exposed to a respective external surface of the magnetic body, wherein each lead part includes at least two regions having different thicknesses, and the thickness of a portion of each lead part having a relatively thin thickness is thinner than a thickness of the internal coil part, and wherein a portion of each lead part having a relatively thick thickness contacts a corresponding end of the internal coil part and the portion of each lead part having the relatively thin thickness contacts the insulating substrate and is exposed to the respective external surface of the magnetic body, wherein an entirety of each lead part does not overlap the internal coil part when viewed in a thickness direction of the magnetic body.

2. The electronic component of claim 1, wherein the portion of each lead part having the relatively thick thickness has the same thickness as the thickness of the internal coil part.

3. The electronic component of claim 1, wherein each lead part has a step shape.

4. The electronic component of claim 1, wherein the portion of each lead part having the relatively thin thickness is disposed relatively close to an outer region of the magnetic body.

5. The electronic component of claim 1, wherein $0.6 \leq b/a < 1$, where a is the thickness of the internal coil part and b is the thickness of the portion of each lead part having the relatively thin thickness.

6. The electronic component of claim 1, wherein $0.6 < d/c < 1$, where c is a width of each lead part and d is a width of the portion of each lead part having the relatively thin thickness is d.

7. The electronic component of claim 1, wherein a thickness of a cover region covering an upper portion of the coil pattern in the magnetic body is at most 150 μm.

8. The electronic component of claim 1, wherein the coil pattern is formed by a plating process.

9. The electronic component of claim 1, wherein the coil pattern comprises a first coil pattern disposed on a first surface of the insulating substrate and a second coil pattern disposed on a second surface of the insulating substrate opposing the first surface of the insulating substrate.

10. The electronic component of claim 1, further comprising external electrodes disposed on outer surfaces of the magnetic body and connected to a corresponding lead part.

11. The electronic component of claim 1, wherein the magnetic body comprises a magnetic metal powder and a thermosetting resin.

12. The electronic component of claim 5, wherein b/a is greater than 0.8 ($b/a > 0.8$).

* * * * *